United States Patent
Lojowski et al.

(10) Patent No.: US 9,671,022 B2
(45) Date of Patent: Jun. 6, 2017

(54) HOUSING SEAL OF TWO HOUSING PARTS LYING AGAINST EACH OTHER

(71) Applicant: Robert Bosch GmbH, Stuttgart (DE)

(72) Inventors: Thomas Lojowski, Sasbach (DE); Christoph Klappenbach, Ottersweier-Unzhurst (DE); Roland Schmidt, Buehl (DE); Claudius Muschelknautz, Buehl (DE); Klaus Eppel, Lauf (DE); Werner Decker, Buehl (DE); Christoph Heier, Iffezheim (DE); Joerg Wolf, Karlsruhe (DE); Guenther Riehl, Buehl (DE); Norbert Knab, Appenweier (DE); Benoit Monzie, Herrlisheim (DE); Jerome Thiery, Strasbourg (FR)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/652,993

(22) PCT Filed: Jul. 25, 2013

(86) PCT No.: PCT/EP2013/065712
§ 371 (c)(1),
(2) Date: Jun. 17, 2015

(87) PCT Pub. No.: WO2014/095096
PCT Pub. Date: Jun. 26, 2014

(65) Prior Publication Data
US 2015/0337962 A1 Nov. 26, 2015

(30) Foreign Application Priority Data
Dec. 17, 2012 (DE) .......................... 10 2012 223 354

(51) Int. Cl.
*F16J 15/02* (2006.01)
*F16J 15/06* (2006.01)
(Continued)

(52) U.S. Cl.
CPC ........... *F16J 15/061* (2013.01); *F16J 15/062* (2013.01); *F16J 15/104* (2013.01); *H05K 5/061* (2013.01)

(58) Field of Classification Search
CPC ........ F16J 15/061; F16J 15/104; H05K 5/061; F16L 23/032; F16L 23/167; F16L 2201/30
(Continued)

(56) References Cited

U.S. PATENT DOCUMENTS 4,699,292 A * 10/1987 Farrell .................... F16J 15/027
114/201 R
5,197,766 A * 3/1993 Glover .................. F16L 23/167
210/165
(Continued)

FOREIGN PATENT DOCUMENTS

CN 101865049 10/2010
DE 102010042137 4/2012
(Continued)

OTHER PUBLICATIONS

International Search Report for Application No. PCT/EP2013/065712 dated Jan. 28, 2014 (English Translation, 2 pages).

*Primary Examiner* — Kristina Fulton
*Assistant Examiner* — Nathan Cumar
(74) *Attorney, Agent, or Firm* — Michael Best & Friedrich LLP

(57) ABSTRACT

The invention relates to known housing seals of two housing parts lying against each other, a first housing part (1) having a first sealing surface (6) and a second housing part (2)

(Continued)

having a second sealing surface (7), which housing seals are equipped with a seal (15), which is inserted into a groove (10) in the first sealing surface (6) of the first housing part (1), wherein the groove (10) is covered by the second sealing surface (7) of the second housing part (2). According to the invention, in order to prevent crevice corrosion, the groove (10) has an opening (11) between the sealing surfaces (6, 7), which is used to ventilate the groove (10) having the inserted seal. The invention is intended for water pumps, in particular for auxiliary water pumps of motor vehicles.

11 Claims, 3 Drawing Sheets

(51) Int. Cl.
*F16J 15/10* (2006.01)
*H05K 5/06* (2006.01)

(58) Field of Classification Search
USPC .................. 277/641; 285/13, 14, 129.1, 924
See application file for complete search history.

(56) References Cited

U.S. PATENT DOCUMENTS 5,743,535 A * 4/1998 Hodgins .................. F16J 9/206
 277/434
5,860,746 A * 1/1999 Roeingh ................ B21B 31/078
 277/350

FOREIGN PATENT DOCUMENTS

| | | | |
|---|---|---|---|
| JP | 2006 012877 | * | 1/2006 |
| JP | 2006012877 | | 1/2006 |
| WO | 9310585 | | 5/1993 |

* cited by examiner

HOUSING SEAL OF TWO HOUSING PARTS LYING AGAINST EACH OTHER

BACKGROUND OF THE INVENTION

The present invention relates to a housing seal or housing seal apparatus of two housing parts lying against each other, a first housing part having a first sealing surface and a second housing part having a second sealing surface, which housing seal comprises a seal which is inserted into a groove in the first sealing surface, wherein the groove is covered by the second sealing surface of the second housing part.

It is required in a plurality of technical applications to protect electronic or mechanical or other components from environmental influences. To this end, multi-piece housings comprising covers and the like are generally used, said housings being sealed by the application of seals. At least in the case of individual housing parts, it is customary to produce the same from metallic materials. This is due to the fact that such materials have appropriate mechanical, electrical or other properties. Metals are, however, generally corrosively attacked by environmental influences, such as moisture, water, salt and the like. Corrosive conditions, as they, for example, prevail in wintry road traffic, therefore lead to an attack on metal parts, which starts at the metallic surface of a component. Because seals are generally inserted in very narrow joint gaps between housing parts, in particular under covers, a greater crevice corrosion occurs in the region of the seals. This crevice corrosion can infiltrate the seal along the metal surfaces so that a leakage and thus the ingress of corrosive mediums from the surrounding environment into the interior of the housing can occur.

SUMMARY OF THE INVENTION

The inventive housing seal or housing seal apparatus has in contrast the advantage that a corrosion induced infiltration of the seal, in particular on metal housings, and an ingress of liquid and corrosive mediums (moisture, salts, etc.) into the interior of the housing can be reliably prevented in a simple manner.

A simple embodiment for the inventive ventilation of the seal is provided if the second sealing surface of the second housing part only minimally projects beyond the groove and if the opening is formed by a bent or, respectively, rounded or angular design of a sealing surface end of the second sealing surface.

In a simple manner, the opening can lead to a recess provided in the second housing part.

In order for the corrosion protection to be further improved if the two housing parts are connected by screws, the recess is formed in the region of screw eyes of the screw connection in the shape of a ventilation groove.

In order to further improve the corrosion protection, the opening is designed as a gap.

An effective corrosion protection has been found to be provided if the opening is designed with an opening width in a range from 0.5 to 1 mm.

An efficient housing seal is provided if the seal is designed as an O-ring seal with a round cross-section.

An efficient housing seal is provided if the seal has an angular, in particular square, cross-section.

An efficient housing seal is provided if at least one housing part consists at least partially of metal.

In one embodiment of the housing seal, a housing part can be designed as a cover.

BRIEF DESCRIPTION OF THE DRAWINGS

Exemplary embodiments of the invention are explained in detail in the following description and further illustrated with the aid of the drawings.

In the drawings.

DETAILED DESCRIPTION

Figure 1:
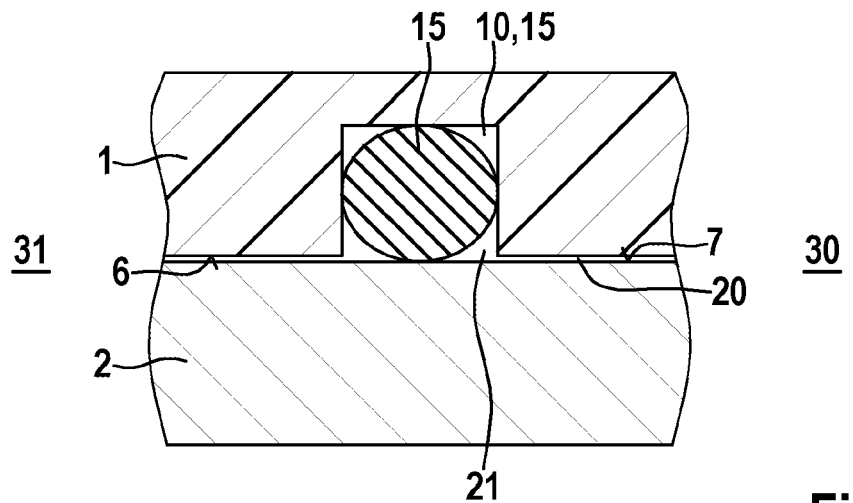
FIG. 1 shows a first embodiment of a housing seal in a simplified sectional view, designed according to the prior art.
Figure 2:
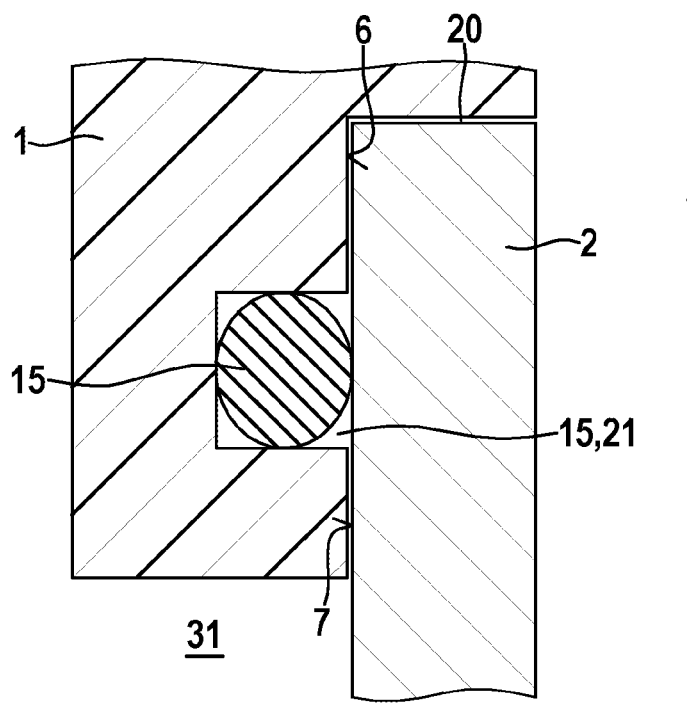
FIG. 2 shows a second embodiment of the housing seal in a simplified sectional view, designed according to the prior art.

Corrosion at seal arrangements is promoted in the region of the provided seal by means of the placement thereof in primarily structurally deep and narrow gaps. Such standard housing seals or, respectively, standard designs are known and shown in detail in FIGS. 1 and 2. In so doing, a circumferential seal 15 in the form of an axially pressed O-ring is situated in a groove 10 in a housing part 1 shown at the top of FIG. 1. The groove 10 is covered by a second lower housing part 2. A joint gap 20 is present between a first sealing surface 6 of the first housing part 1 and a second sealing surface 7 of the second housing part. In addition, a groove space 21 which is not filled by the seal is present and likewise forms a gap. On the right in FIGS. 1 to 5, a corrosive environment on the exterior of the housing is denoted by an arrow 30 and an opposite lying housing interior by the reference number 31. In FIG. 2, the arrangement has a vertical orientation comprising sealing surfaces 6, 7 that run vertically and bend horizontally on one side. The O-ring 15 is then correspondingly pressed in the radial direction. The second housing part 2 is partially accommodated on the upper side thereof by the first housing part 1, so that in total an angled, longer gap extension 20 with respect to that in FIG. 1 is present. In FIGS. 1 and 2, the first housing part 1 is manufactured from plastic and the second housing part 2 from metal.

In the embodiments according to FIGS. 1 and 2, corrosion arises in the region of the seal 15. The reason for this is the capillary effect of the gap 20 and the groove space 21 which lead the corrosive medium to the seal 15 or, respectively, the sealing location. This leads to a slowing down of the drying process in the gaps 20 or in the groove space 21. The obstruction of the air or, respectively, oxygen access to the gaps 20 or to the groove space 21 promotes the crevice corrosion. In the case of widely used metals, such as aluminum and stainless steel, the oxygen access is furthermore necessary for resisting corrosion by allowing passive layers to be formed. As a result of the obstruction of air or oxygen access to said gaps, the corrosive conditions are further intensified by the corrosive reactions which then occur, and an intensification of the accumulation of corrosive products, for example chloride concentrations, and a lowering of the pH value can occur in the joint gap.

Figure 3:
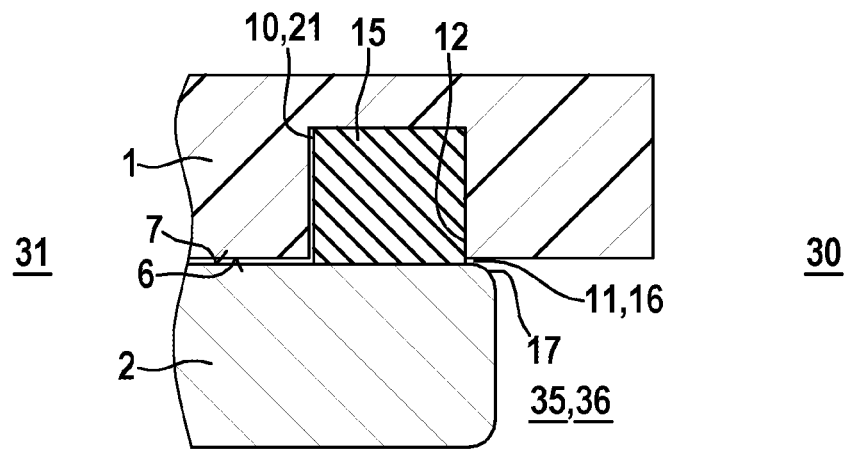
FIG. 3 shows a first embodiment of the housing seal according to the invention in a simplified sectional view.

All of the parts that are the same or have a similar function are provided with the same reference signs in the following exemplary embodiments as in FIGS. 1 and 2. In FIG. 3, a first inventive housing sealing of the two housing parts 1, 2 is depicted by means of a seal 15. An upper, first housing part 1 rests with the upper, first sealing surface 6 thereof against a lower, second sealing surface 7 of a lower, second housing part 2. The upper housing part 1 has a groove 10 that is introduced into the upper sealing surface 6 thereof. A seal 15 having an angular, in particular square, cross-section is inserted into the groove 10 as a so-called hose section seal. Provision can also be made to dispose a seal 15 with a rectangular cross-section in a corresponding groove. It is also possible to design the seal 15 with a round cross-section as in FIGS. 1 and 2 as a so-called O-ring seal. The use of seals having an angular cross-section has the advantage that the formation of a circumferential gap, which results from supporting a round sealing ring on flat surfaces, is reduced. The housing seal according to the invention is, however, also advantageous when using O-rings with a round cross-section or for liquid seals. The groove 10 is completely covered by the lower housing part 2. According to the invention, provision is now made for the groove 10 to have an opening 11 between the sealing surfaces 6, 7, which is used to ventilate the groove 10 or, respectively, the groove space 21 having the seal 15. The opening 11 is provided at a corner region of an interior wall 12 to the lower sealing surface 7, which interior wall faces the exterior of the housing 30 and forms a connection to a free region 35 in the second housing part 2 or directly to the surrounding environment. The free region 35 can be designed as a circumferential material recess 36 in the second housing part 2. The opening 11 can extend radially along the seal 15 and form a slot 16 in the groove 10 or, respectively, in the groove space 21. The second sealing surface 7 projects only minimally beyond the groove 10, and the opening 11 is formed by a bent or rounded or angular configuration of a sealing surface end 17 of the second sealing surface 7.

Figure 4:
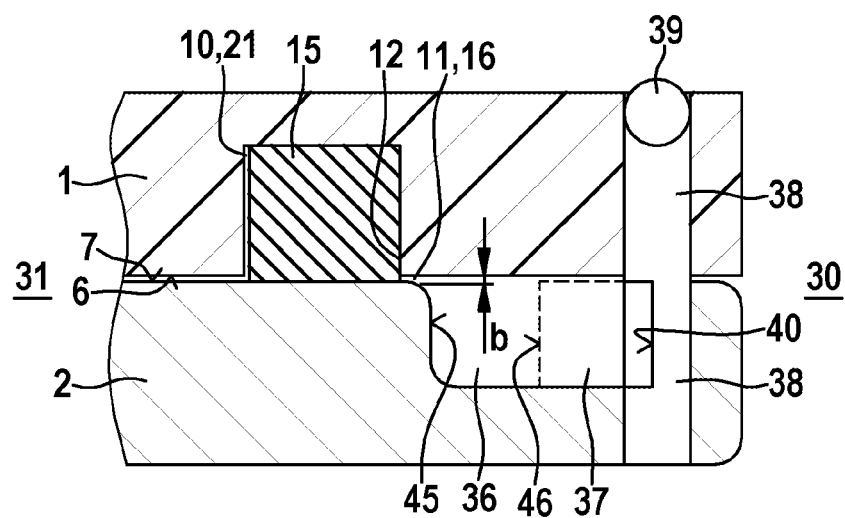
FIG. 4 shows a second embodiment of the housing seal according to the invention in a simplified sectional view.

As a second exemplary embodiment according to the invention is depicted in FIG. 4, the free region 35 can be designed as a ventilation groove 37 which extends between the groove 10 comprising the seal 15 and a screw connection 39 that is provided; or, respectively, along screw eyes 38 of the two housing parts 1, 2. By means of the inventive opening 11 to a free space 35 or to a ventilation groove 37, the drying process and the air admission, in particular in the critical region, are improved considerably by the screw eyes 38 that are provided. This results from the fact that a gap is no longer present, or rather an uncritical dimension is no longer present. In so doing, the mechanism of the crevice corrosion is not activated and a further intensification of the corrosive conditions resulting from the consequential effects of a gap is prevented. A capillary effect is advantageously prevented by the opening 11 and the ingress of liquid into the sealing region is also prevented, which also has advantages for the housing parts 1, 2 that consist partially or completely of plastic. The opening 11 is therefore to be designed considerably larger than a possible joint gap in order to thus prevent the capillary effect. A dimension in a range of 0.5 to 1 mm has proven to be effective as an advantageous opening width b for the opening.

Figure 5:
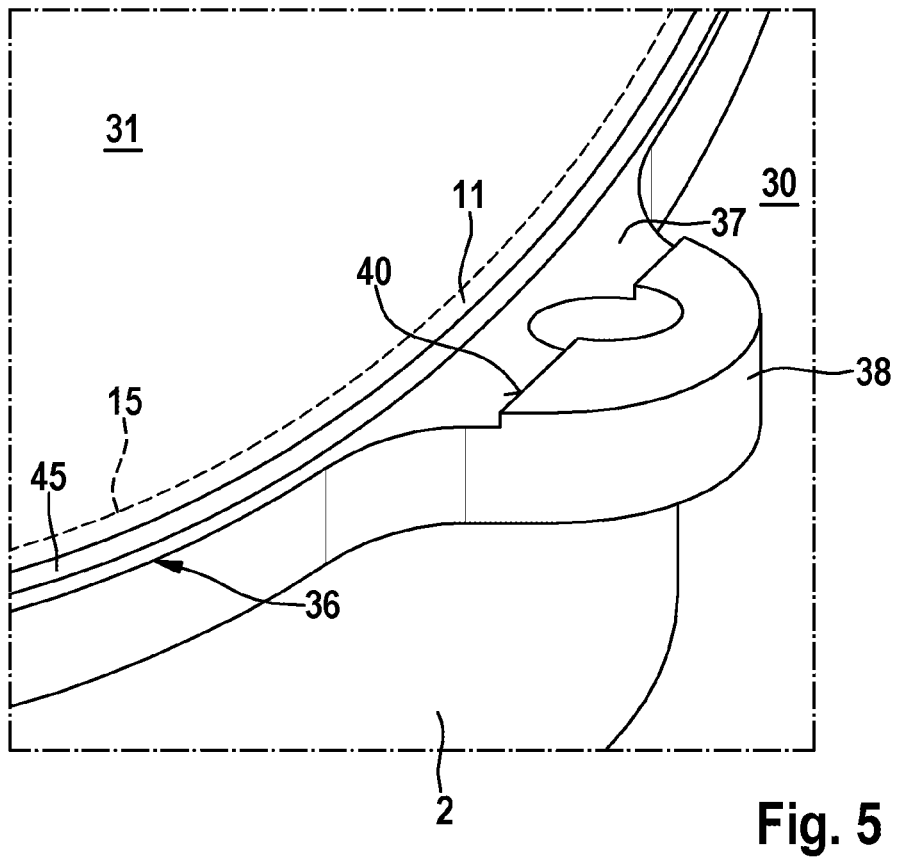
FIG. 5 shows a perspective view of a third embodiment of housing seal according to the invention, illustrated by way of an example of a housing cover.
Figure 6:
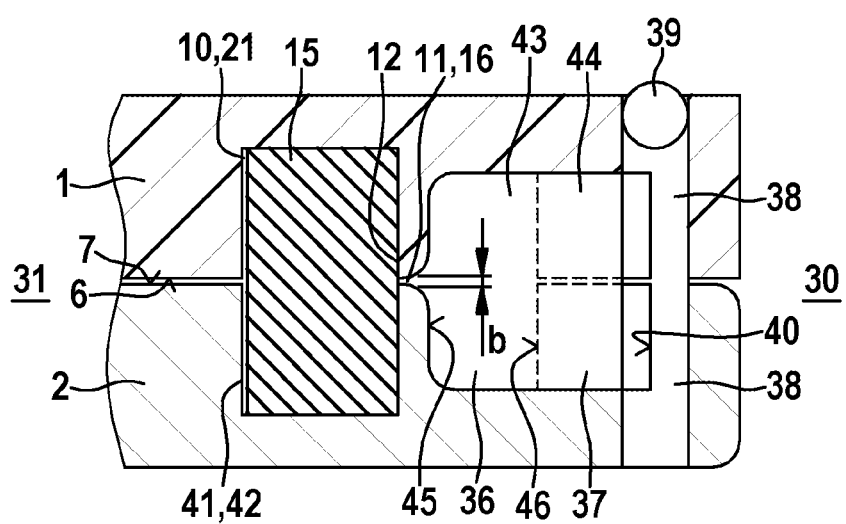
FIG. 6 is a sectional view, similar to FIG. 3, of the third embodiment.

As a third exemplary embodiment of the housing seal according to the invention is depicted in FIG. 5, the housing seal can be provided for an electronic housing cover. The housing cover thereby constitutes the first housing part 1 which is sealingly connected to the second, cylindrically designed housing part 2, which is, for example, provided for electronic components. A circumferential material recess 36 according to FIG. 3 can be seen which continues on in the form of a ventilation groove 37 in the region of the screw eyes 38 that are provided. The circumferential seal 15 is indicated by a dashed line and can be designed as an O-ring seal having a round cross-section or as a so-called hose section seal having an angular, in particular square, cross-section.

Deep, narrow gaps are prevented by means of the housing seal according to the invention. This ensures a reduction in the ingress of corrosive mediums from the exterior environment of the housing 30 into the region of the seal 15. In addition, an accelerated drying process and an improved admission of oxygen to the sealing surfaces 6, 7, in particular to the metal surface of the second sealing surface 7 of the second housing part 7, is possible. The infiltration of a medium past the seals or, respectively, crevice corrosion can therefore be prevented. In FIGS. 3 and 4, the first housing part 1 can be manufactured from plastic and the second housing part 2 from metal. It is also possible for both housing parts 1, 2 to be completely manufactured from metal or completely from plastic. Because the ingress of liquid into the sealing region is reduced, the invention can also be used with plastic surfaces without corrosive effects.

The invention is intended for water pumps, in particular for auxiliary water pumps of motor vehicles.

The invention claimed is:

1. A housing seal apparatus comprising two housing parts lying against each other, the two housing parts including a first housing part (1) having a first sealing surface (6) and a second housing part (2) having a second sealing surface (7), and the housing seal apparatus comprising a seal (15), which is inserted into a groove (10) in the first sealing surface of the first housing part, wherein the second sealing surface (7) of the second housing part (2) extends straight across the entire groove (10) such that the groove is completely covered by the second sealing surface of the second housing part, wherein an opening (11) defining an opening width (b) in a range of 0.5 to 1 mm is provided between the sealing surfaces (6, 7), the opening being configured to ventilate the groove (10), wherein the opening (11) extends directly radially outwardly from the seal (15) to form a slot (16) directly connecting the groove (10) to a free region (35) of the second housing part (2) or to the surrounding environment, characterized in that the opening (11) leads to a recess (36) in the second housing part (2), which is provided on said second housing part (2), and characterized in that the recess (36) forms a ventilation groove (37) in a region of screw eyes (38) of a screw connection (39).

2. The housing seal apparatus according to claim 1, characterized in that the second sealing surface (7) of the second housing part (2) only minimally projects beyond the groove (10), and the opening (11) is formed by a bent or rounded sealing surface end (17) of the second sealing surface (7).

3. The housing seal apparatus according to claim 1, characterized in that the opening (11) is a gap (16).

4. The housing seal apparatus according to claim 1, characterized in that the seal (15) is an O-ring seal having a round cross-section.

5. The housing seal apparatus according to claim 1, characterized in that the seal (15) has an angular cross-section.

6. The housing seal apparatus according to claim 1, characterized in that at least one housing part (1; 2) is made at least partially of metal.

7. The housing seal apparatus according to claim 1, characterized in that one of the two housing parts (1; 2) is a cover.

8. The housing seal apparatus according to claim 1, characterized in that the seal (15) has a square cross-section.

9. The housing seal apparatus according to claim 1, characterized in that the seal (15) has a rectangular cross-section.

10. The housing seal apparatus according to claim 1, characterized in that the seal is also inserted into a groove in the second sealing surface of the second housing part.

11. The housing seal apparatus according to claim 1, characterized in that the slot (16) directly connects the groove (10) to a recess (43) in the first housing part.

* * * * *